United States Patent [19]

Hagihara

[11] Patent Number: 4,724,611
[45] Date of Patent: Feb. 16, 1988

[54] METHOD FOR PRODUCING SEMICONDUCTOR MODULE

[75] Inventor: Takashi Hagihara, Tokyo, Japan

[73] Assignee: NEC Corporation, Tokyo, Japan

[21] Appl. No.: 898,428

[22] Filed: Aug. 20, 1986

[30] Foreign Application Priority Data

Aug. 23, 1985 [JP] Japan .................................. 60-183889

[51] Int. Cl.⁴ .............................................. H05K 3/30
[52] U.S. Cl. .......................................... 29/840; 29/832
[58] Field of Search .................... 29/840, 832, 576 R, 29/827, 874

[56] References Cited

U.S. PATENT DOCUMENTS 2,999,034 9/1961 Heidenhain ............................ 29/874
4,439,918 4/1984 Carroll et al. ......................... 29/840
4,467,522 8/1984 Marchisi ................................ 29/827

FOREIGN PATENT DOCUMENTS 86130 6/1980 Japan ..................................... 29/840
70655 6/1981 Japan ..................................... 29/832

OTHER PUBLICATIONS

New International and External Cooling Enhancements for the Air-Cooled IBM 4381 Module, Nov. 1, 1983.

Electrical Design and Analysis of the Air–Cooled Module (ACM) in IBM System/4381, Nov. 1, 1983.

Primary Examiner—William R. Briggs
Attorney, Agent, or Firm—Burns, Doane, Swecker & Mathis

[57] ABSTRACT

A semiconductor module and a producing method thereof are disclosed. The semiconductor module has a cooling chamber storing a heat-conductive material which is contracted by solidification, semiconductor chips mounted on the lower surface of a substrate and dipped in the heat-conductive material, and a substrate frame, mounted on the cooling chamber, for holding the substrate. A small gap having a width $h_1$ is formed between the semiconductor chips and the solidified heat-conductive material surface due to contraction of the heat-conductive material by cooling and solidification and, thereafter, the semiconductor module is assembled to have a spacer having a thickness t interposed between the cooling chamber and the substrate frame, thereby forming a gap having a size of $h_1 + t$ between the semiconductor chips and the heat-conductive material.

The gap h can be reduced, thus reducing a heat resistance.

5 Claims, 6 Drawing Figures

METHOD FOR PRODUCING SEMICONDUCTOR MODULE

BACKGROUND OF THE INVENTION

The present invention relates to a semiconductor module having a high cooling capability and a producing method thereof.

Conventionally, various cooling techniques for semiconductor modules, more particularly, LSI (Large Scale Integration) semiconductor modules have been proposed. For example, one such technique is described in an article entitled "NEW INTERNAL AND EXTERNAL COOLING ENHANCEMENTS FOR THE AIR COOLED IBM 4381 MODULE" in IEEE International Conference on Computer Design, 1983. In this technique, a small gap is present between a semiconductor chip (referred to as chip, hereinafter) mounted on a substrate and a cap opposite the chip. The cooling capability of the cap for the chip is largely influenced by the size of the small gap. That is, when the small gap is reduced, the heat resistance is decreased to enhance the cooling capability. In the above article, it was reported that when the small gap was kept to be 0.2 mm and a heat-conductive compound or a thermal paste was filled in the gap, the heat resistance between the chip and the cap was 9° C./W.

However, in such an LSI semiconductor module, the substrate, chip, cap, and the like as constituents for the semiconductor module have dimensional errors, and a total of these errors and assembly errors amounts to 100 to 200 μm. If the small gap is designed to be smaller than the total errors, the chip is undesirably brought into contact with the cap and they may be damaged. Therefore, in the conventional semiconductor module, it is difficult to reduce the small gap to be smaller than the total errors to attain reduced heat resistance, and hence, the module has a low cooling capability for the chip.

SUMMARY OF THE INVENTION

It is an object of the present invention to provide a producing method of a semiconductor module which is free from the conventional drawbacks, and is capable of reducing a gap to be smaller than total dimensional error of constituents for the semiconductor module, and a semiconductor module produced by the producing method.

According to the present invention, there is provided a producing method of a semiconductor module comprising the steps of: fixing a substrate, on a lower surface of which a plurality of semiconductor chips are mounted, to a substrate holding member for holding the substrate at its periphery; filling a melt of a heat-conductive material, in a dish-like chamber having an upper, outer peripheral surface opposite the lower surface of the substrate holding member; assembling the substrate and the chamber, such that the lower surface of the substrate holding member is brought into contact with the upper, outer peripheral surface of the chamber, thereby dipping a lower portion of each of the semiconductor chip in the melt of the heat-conductive material; solidifying the melt of the heat-conductive material to contract it, thereby forming a small gap between the surface of the solidified heat-conductive material and the lower surface of each of the semiconductor chips; separating the substrate holding member and the substrate from the chamber and inserting a spacer having a predetermined thickness between the lower surface of the substrate holding member and the upper, outer peripheral surface of the chamber; and assembling the assembly and the chamber through the spacer.

According to the present invention, there is provided a semiconductor module comprising: a substrate, on a lower surface of which a plurality of semiconductor chips are mounted; a substrate holding member fixed to the periphery of the substrate, a dish-like chamber having an upper, peripheral surface opposite the substrate holding member; a heat-conductive material which is contracted due to cooling and solidification, the heat-conductive material initially representing a molten state in the chamber, the substrate holding member and the chamber being assembled such that the lower surface of the substrate holding member and the upper, outer peripheral surface of the chamber are brought into contact with each other, thereby dipping the lower portion of each of the semiconductor chip into the molten heat-conductive material, and the heat-conductive material being cooled to be solidified and contracted, thereby forming a gap $h_1$ between the surface of each of the semiconductor chips and the surface of the solidified heat-conductive material; and a spacer having a thickness t and inserted between the lower surface of the substrate holding member and the upper, outer peripheral surface of the chamber, the semiconductor module being assembled to finally have a gap of $h_1+t$ between the lower surfaces of the semiconductor chips and the upper surface of the solidified heat-conductive material.

DETAILED DESCRIPTION OF THE PREFERRED EMBODIMENT

A producing method of a semiconductor module of the present invention will now be described with reference to the accompanying drawings.

FIGS. 1 to 5 are side sectional views sequentially showing the steps in the manufacture of the semiconductor module.

Figure 1:
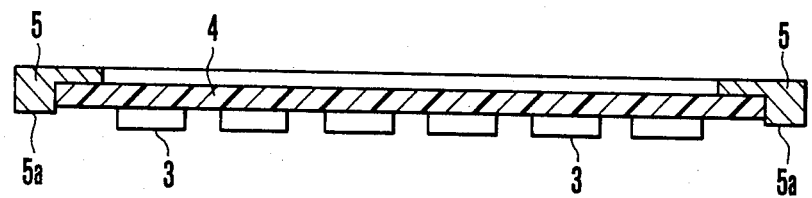
FIGS. 1 to 5 are side sectional views for explaining the steps in a method of producing a semiconductor module according to an embodiment of the present invention.
Figure 2:
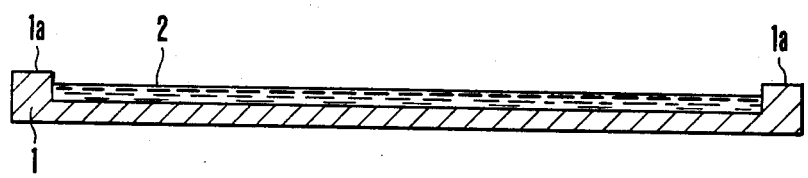

As shown in FIG. 1, a substrate frame 5 which has a substantially L-shaped section is fixed to the outer periphery of a substrate 4. A plurality of LSI semiconductor chips 3 are mounted on the lower surface of the substrate 4. The substrate frame 5 and the substrate 4 mounting the semiconductor chips 3 are thus capable of being integrally moved.

A heat-conductive material 2 (in this embodiment, solder) which is melted by heating and solidified and contracted when cooled, is melted by heating and filled in a predetermined amount (to be described later) in a dish-like cooling chamber 1 having an outer periphery opposing a lower surface 5a of the substrate frame 5.

Figure 3:
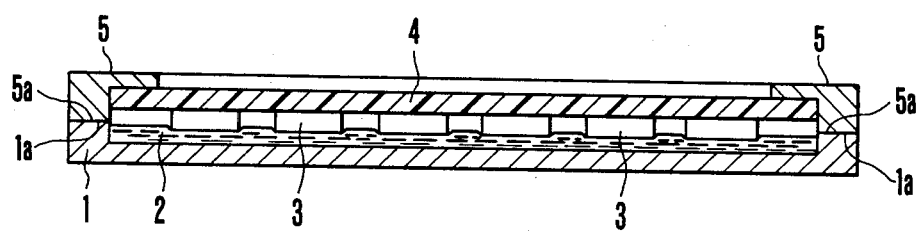

As shown in FIG. 3, the substrate frame 5 is mounted on and fixed to the cooling chamber 1, so that a lower surface 5a of the frame 5 abuts against an upper, outer peripheral surface 1a of chamber 1. The amount of molten solder 2 is predetermined, such that the surfaces of the chips 3 are sufficiently brought into contact with the surface of the molten solder 2 when the substrate frame 5 abuts against the cooling chamber 1. Prior to the above assembly, each of the chips 3 is subjected to a solder wet-prevention process. However, if each chip 3 is housed in a ceramic casing, the solder wet-prevention process need not be performed.

Figure 4:
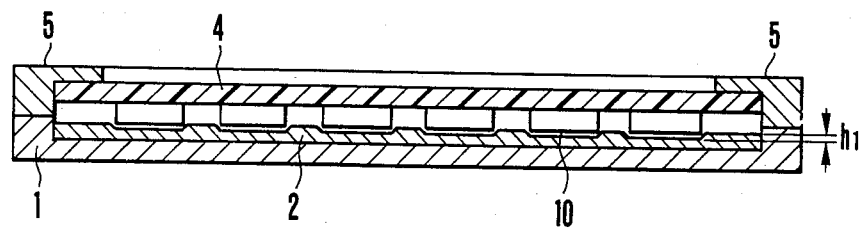
Figure 5:
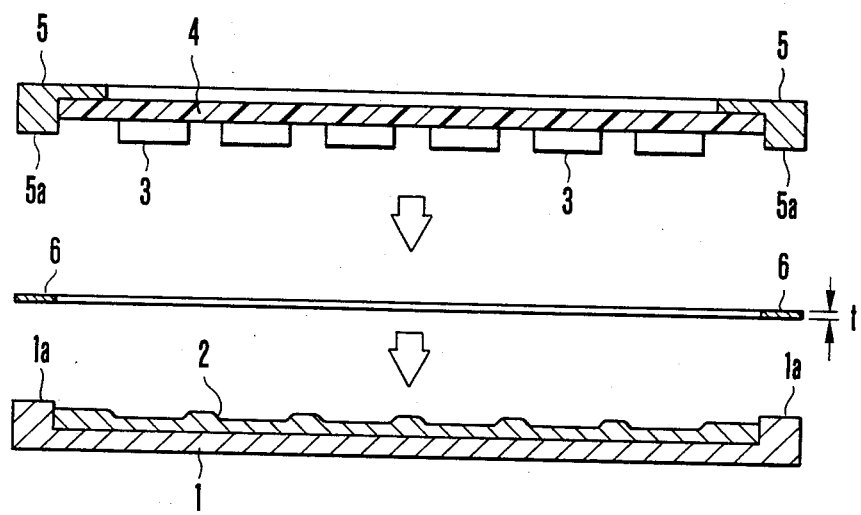

Heating of the molten solder 2 is interrupted in the state shown in FIG. 3. Upon interruption of heating, the temperature of the molten solder 2 gradually decreases, and the molten solder is solidified while being contracted due to a decrease in temperature. Since each chip 3 is subjected to the solder wet-prevention process, a small gap 10 having a size $h_1$ is formed between the surface of the solidified solder 2 and the chips 3 due to contraction of the molten solder 2, as shown in FIG. 4.

The substrate frame 5 is temporarily separated from the cooling chamber 1, thereby separating the chips 3 from the solder 2. Since the solder 2 has been solidified, it maintains the sectional shape shown in FIG. 4.

The separated upper and lower portions are washed to remove foreign materials, e.g., flux. After washing, a spacer 6 having a thickness t is inserted between the lower surface 5a of the substrate frame 5 and the upper, outer peripheral surface 1a of the cooling chamber 1, and the resultant structure is then assembled. A gap given by $h = h_1 + t$ is obtained between the surface of the solder 2 and the lower surfaces of the chips 3. The thickness of the spacer 6 can be arbitrarily selected.

In this embodiment, the molten solder is charged in the cooling chamber 1. However, a predetermined amount of solder can be attached in advance to the cooling chamber 1, and the attached solder can be heated to be melted. In this embodiment, the solder 2 is used. However, the present invention is not limited to solder, and other materials, i.e., heat-conductive materials which are contracted upon solidification, can also be used. Not only the materials which are melted by heating and solidified by cooling, but also such materials as EPO-TEK H 35-175 paste (produced by Epoxy Technology Inc.) which is in fluid state at normal temperature but solidified and contracted at a higher temperature than 180° C., can be used.

Figure 6:
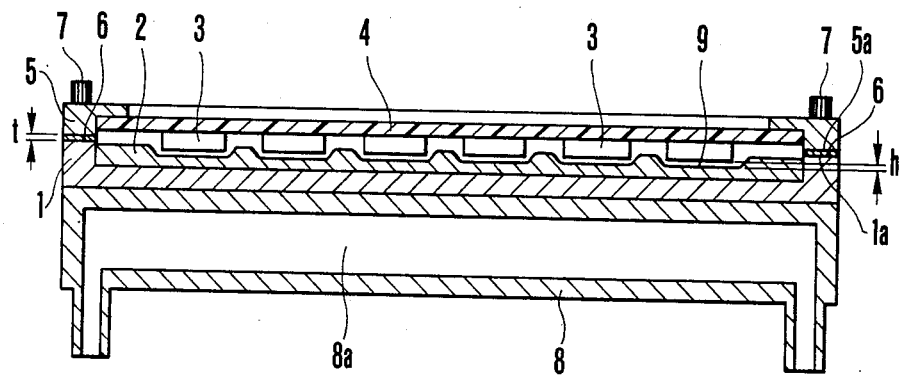
FIG. 6 is a side sectional view of a semiconductor module according to an embodiment of the present invention.

FIG. 6 shows a side sectional view of an embodiment of a semiconductor module manufactured by the above-mentioned method. Referring to FIG. 6, the same reference numerals in FIG. 6 denote the same parts as in FIGS. 1 to 5. Reference numeral 7 denotes an assembling screw extending through the substrate frame 5, the spacer 6, and the cooling chamber 1. Reference numeral 8 denotes a water-cooled jacket, which is fixed to the cooling chamber 1 and has a hollow portion 8a, through which water flows to perform a water cooling operation.

If a heat-conductive compound can be filled in a small gap 9, further improved cooling characteristics can be obtained. This embodiment adopts a water-cooling structure, but can adopt an air-cooling structure if a fin is mounted on the cooling chamber 1.

According to the producing method of the semiconductor module of the present invention as described above, after a small gap $h_1$ is formed between chips and a solidified heat-conductive material surface due to cooling and solidification of a molten heat-conductive material, a spacer having a predetermined thickness t is inserted between a cooling chamber and a substrate holding member and the resultant structure is assembled. Therefore, if the thickness t of the spacer is appropriately selected, a small gap $(h_1 + t)$ of an optimal size can be set between the chips and the heat-conductive material surface. The small gap can be reduced to be smaller than a total of dimensional errors and assembly errors of constituents, thus greatly reducing a heat resistance when compared with a conventional semiconductor module. In addition, a cooling capability can be noticeably improved.

What is claimed is:

1. A producing method of a semiconductor module comprising the steps of: fixing a substrate, on a lower surface of which a plurality of semiconductor chips are mounted, to a substrate holding member for holding said substrate at its periphery; filling a melt of a heat-conductive material, in a dish-like chamber having an upper, outer peripheral surface opposite the lower surface of said substrate holding member; assembling said substrate and said chamber, such that the lower surface of said substrate holding member is brought into contact with the upper, outer peripheral surface of said chamber, thereby dipping a lower portion of each of said semiconductor chip in the heat-conductive material; solidifying the melt of the heat-conductive material to contract it, thereby forming a small gap between the surface of the solidified heat-conductive material and the lower surface of each of said semiconductor chips; separating an assembly of said substrate holding member and said substrate from said chamber and inserting a spacer having a predetermined thickness between the lower surface of said substrate holding member and the upper, outer peripheral surface of said chamber; and assembling said assembly and said chamber through said spacer.

2. A method according to claim 1, further including the step of washing said substrate holding member and said chamber after they are separated.

3. A method according to claim 1, wherein said heat-conductive material is melted by heating and solidified by cooling, said melt filling step comprising melting the heat-conductive material in said chamber and said solidifying step comprising cooling of the melt.

4. A method according to claim 3, wherein said cooling of said heat-conductive material is realized by stopping heating.

5. A method according to claim 1, wherein said heat-conductive material is fluid at normal temperature and solidified by heating, said melt filling step comprising pouring the heat-conductive material at normal temperature into said chamber and said solidifying step comprising heating the material.

* * * * *